US012682971B2

(12) United States Patent
Chen

(10) Patent No.: US 12,682,971 B2
(45) Date of Patent: Jul. 14, 2026

(54) METHOD FOR DETERMINING MEMORY STABILITY AND TESTING COVERAGE

(71) Applicant: Winbond Electronics Corp., Taichung City (TW)

(72) Inventor: Shih-Hung Chen, Hsinchu (TW)

(73) Assignee: Winbond Electronics Corp., Taichung City (TW)

( * ) Notice: Subject to any disclaimer, the term of this patent is extended or adjusted under 35 U.S.C. 154(b) by 62 days.

(21) Appl. No.: 18/884,079

(22) Filed: Sep. 12, 2024

(65) Prior Publication Data

US 2025/0372189 A1　　Dec. 4, 2025

(30) Foreign Application Priority Data

Jun. 3, 2024　(TW) ................................. 113120534

(51) Int. Cl.
G11C 29/10 (2006.01)
(52) U.S. Cl.
CPC .................................... G11C 29/10 (2013.01)
(58) Field of Classification Search
CPC ...................................................... G11C 29/10
See application file for complete search history.

(56) References Cited

U.S. PATENT DOCUMENTS

| | | | | |
|---|---|---|---|---|
| 2002/0199136 A1* | 12/2002 | Ku | ......................... | G11C 29/48 |
| | | | | 714/30 |
| 2008/0072118 A1* | 3/2008 | Brown | ............. | G11C 29/56008 |
| | | | | 714/763 |
| 2020/0075117 A1* | 3/2020 | Lai | ......................... | G11C 29/54 |
| 2023/0274788 A1* | 8/2023 | Noguchi | ............... | G11C 29/42 |
| | | | | 365/185.09 |

* cited by examiner

*Primary Examiner* — Thien Nguyen
(74) *Attorney, Agent, or Firm* — JCIPRNET

(57) ABSTRACT

Disclosed is a method for determining a memory stability and a testing coverage. The method includes: providing multiple testing programs, for testing each memory die by using one of the testing programs to generate a failure bit information of each memory die; acquiring the failure bit information of each memory die tested with the each testing program; acquiring a failure bit address information of each memory die tested with each testing program based on the failure bit information of each memory die; acquiring a common failure bit address of the testing programs based on the failure bit address information of each memory die, or acquiring a different failure bit address of each testing program based on the failure bit address information of each memory die; and determining a testing coverage based on the common failure bit address, or determining a testing coverage based on the different failure bit address.

16 Claims, 13 Drawing Sheets

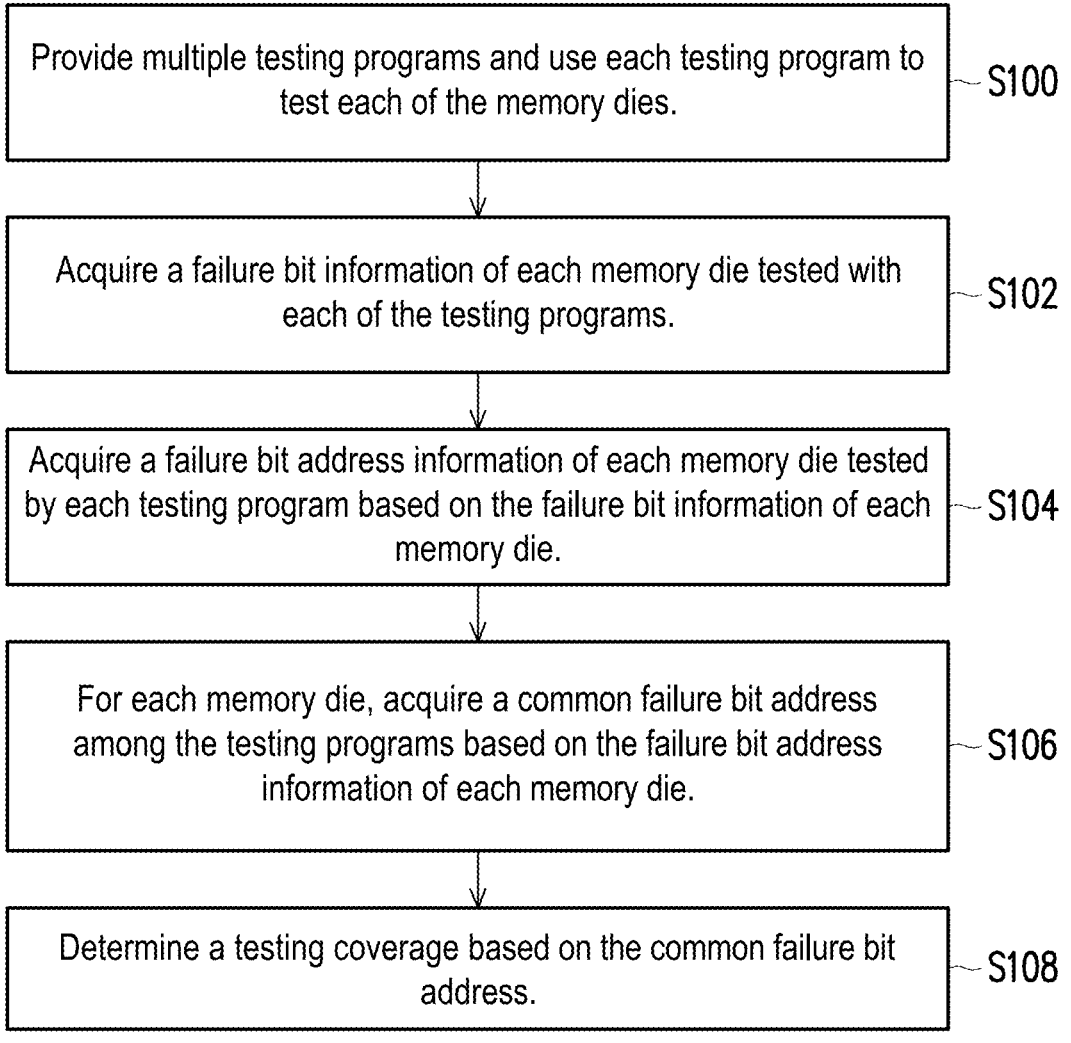

Provide multiple testing programs and use each testing program to test each of the memory dies. —S100

Acquire a failure bit information of each memory die tested with each of the testing programs. —S102

Acquire a failure bit address information of each memory die tested by each testing program based on the failure bit information of each memory die. —S104

For each memory die, acquire a common failure bit address among the testing programs based on the failure bit address information of each memory die. —S106

Determine a testing coverage based on the common failure bit address. —S108

FIG. 3A

| Testing program PGM | Number of common failure bits | |
|---|---|---|
| PGM 1-1 | 109196 | |
| PGM 1-2 | 112709 | |
| PGM 1-3 | 130899 | ← Greatest number |
| PGM 1-4 | 103895 | |
| PGM 1-5 | 84522 | |
| PGM 2-1 | 140899 | |
| PGM 2-2 | 149591 | |
| PGM 2-3 | 133608 | |
| PGM 2-4 | 155179 | ← Greatest number |
| PGM 2-5 | 143721 | |
| PGM 2-6 | 140976 | |
| PGM 2-7 | 145355 | |
| PGM 2-8 | 149120 | |
| PGM 2-9 | 128601 | |
| PGM 2-10 | 126120 | |
| PGM 3-1 | 144364 | ← Greatest number |
| PGM 3-2 | 93654 | |
| PGM 3-3 | 100927 | |
| PGM 3-4 | 113756 | |
| PGM 3-5 | 119424 | |
| PGM 3-6 | 129574 | ← Greatest number |
| PGM 3-7 | 117847 | |
| PGM 4-1 | 103511 | |
| PGM 4-2 | 118102 | |
| PGM 4-3 | 120934 | |
| PGM 4-4 | 93655 | |
| PGM 4-5 | 126383 | ← Greatest number |
| PGM 4-6 | 98714 | |
| PGM 4-7 | 77524 | |
| PGM 4-8 | 40086 | |

Function: PGM 1-1 through PGM 1-5

Pause: PGM 2-1 through PGM 2-10

Margin: PGM 3-1 through PGM 3-7

Timing: PGM 4-1 through PGM 4-8

FIG. 4

| Testing program PGM | Number of different failure bits | % | |
|---|---|---|---|
| PGM 1-1 | 229 | 0.0 | I |
| PGM 1-2 | 1250 | 0.2 | |
| PGM 1-3 | 361 | 0.0 | |
| PGM 1-4 | 367 | 0.0 | |
| PGM 1-5 | 81416 | 10.3 | |
| PGM 1-6 | 572 | 0.1 | |
| PGM 2-1 | 75 | 0.0 | II |
| PGM 2-2 | 276 | 0.0 | |
| PGM 2-3 | 144 | 0.0 | |
| PGM 2-4 | 9231 | 1.2 | |
| PGM 2-5 | 181 | 0.0 | |
| PGM 2-6 | 475 | 0.1 | |
| PGM 2-7 | 826 | 0.1 | |
| PGM 2-8 | 298 | 0.0 | |
| PGM 2-9 | 10378 | 1.3 | |
| PGM 2-10 | 19656 | 2.5 | |
| PGM 3-1 | 153 | 0.0 | III |
| PGM 3-2 | 3435 | 0.4 | |
| PGM 3-3 | 16598 | 2.1 | |
| PGM 3-4 | 1102 | 0.1 | |
| PGM 3-5 | 2330 | 0.3 | |
| PGM 3-6 | 11059 | 1.4 | |
| PGM 3-7 | 44038 | 5.6 | |
| PGM 4-1 | 776 | 0.1 | IV |
| PGM 4-2 | 891 | 0.1 | |
| PGM 4-3 | 649 | 0.1 | |
| PGM 4-4 | 1136 | 0.1 | |
| PGM 4-5 | 8935 | 1.1 | |
| PGM 4-6 | 53948 | 6.8 | |
| PGM 4-7 | 35244 | 4.5 | |
| PGM 4-8 | 116090 | 14.7 | |
| PGM 4-9 | 12085 | 1.5 | |
| Total different failure bits | 43,4204(54.9%) | 79,0437(100%) | |

FIG. 6

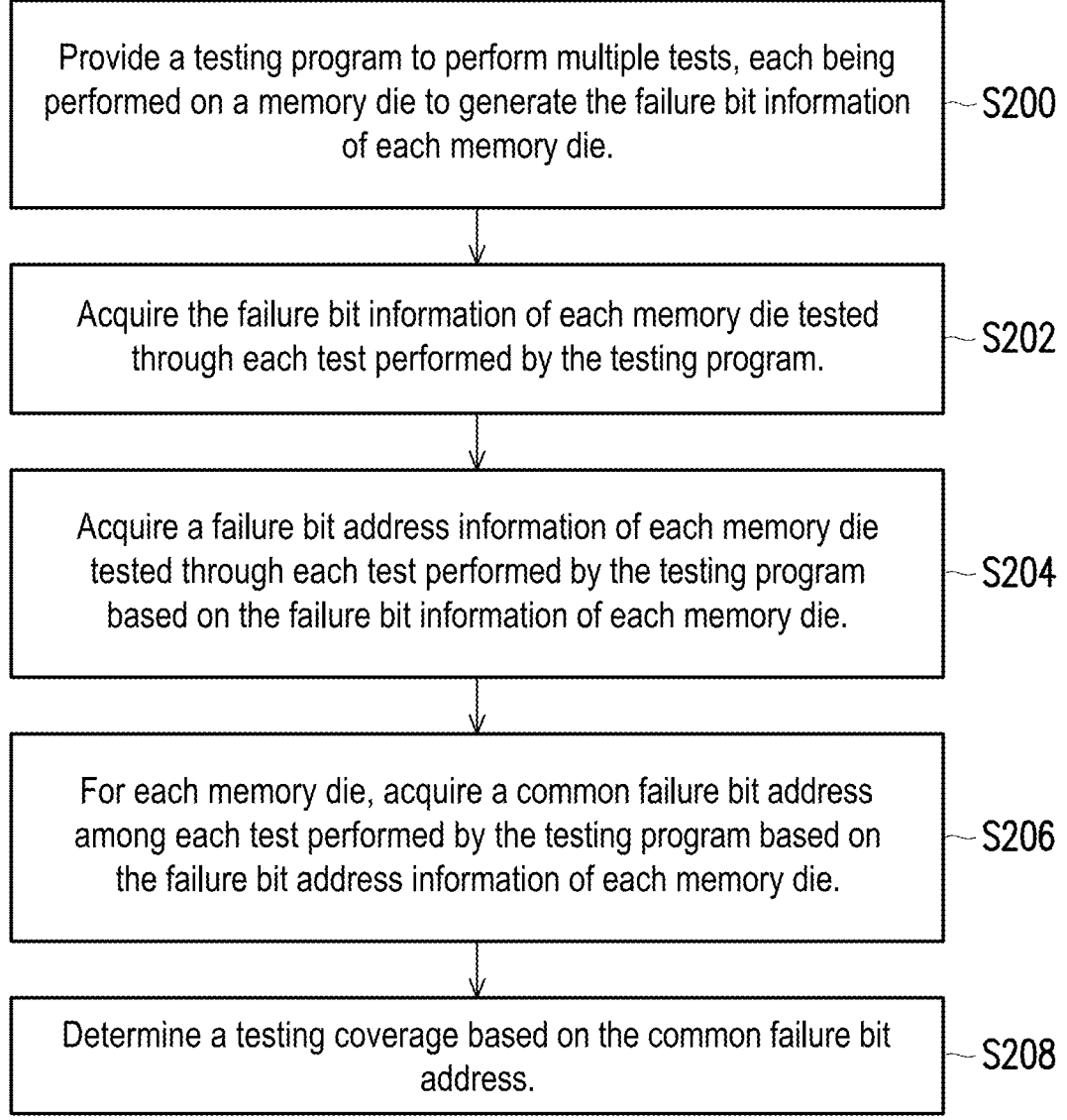

Provide a testing program to perform multiple tests, each being performed on a memory die to generate the failure bit information of each memory die.          ~S200

Acquire the failure bit information of each memory die tested through each test performed by the testing program.          ~S202

Acquire a failure bit address information of each memory die tested through each test performed by the testing program based on the failure bit information of each memory die.          ~S204

For each memory die, acquire a common failure bit address among each test performed by the testing program based on the failure bit address information of each memory die.          ~S206

Determine a testing coverage based on the common failure bit address.          ~S208

FIG. 7A

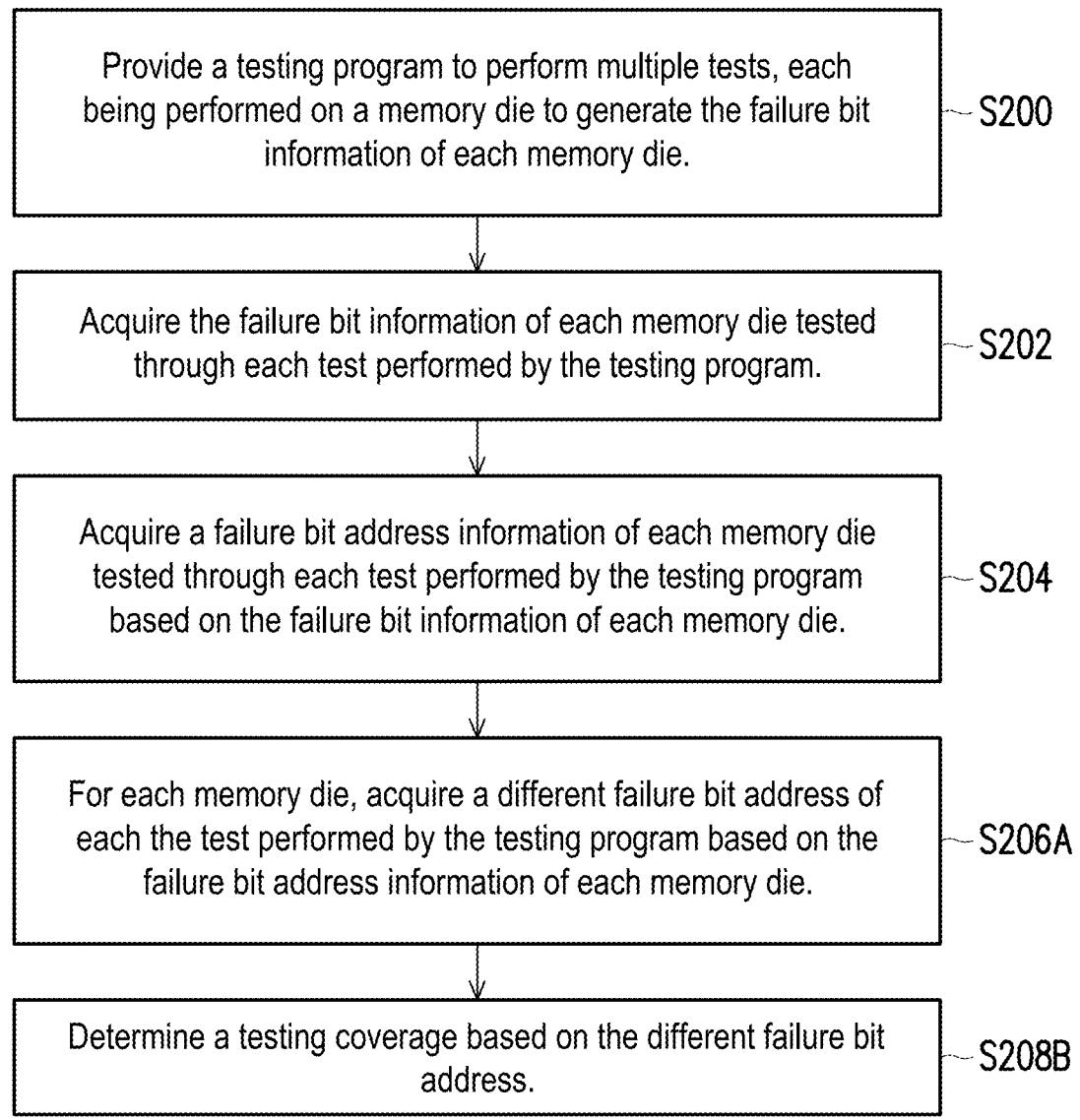

Provide a testing program to perform multiple tests, each being performed on a memory die to generate the failure bit information of each memory die. ──S200

Acquire the failure bit information of each memory die tested through each test performed by the testing program. ──S202

Acquire a failure bit address information of each memory die tested through each test performed by the testing program based on the failure bit information of each memory die. ──S204

For each memory die, acquire a different failure bit address of each the test performed by the testing program based on the failure bit address information of each memory die. ──S206A Determine a testing coverage based on the different failure bit address. ──S208B

FIG. 8A

METHOD FOR DETERMINING MEMORY STABILITY AND TESTING COVERAGE

CROSS-REFERENCE TO RELATED APPLICATION

This application claims the priority benefit of Taiwan application serial no. 113120534, filed on Jun. 3, 2024. The entirety of the above-mentioned patent application is hereby incorporated by reference herein and made a part of this specification.

BACKGROUND

Technical Field

The disclosure relates to a method for determining a memory stability and a testing coverage.

Description of Related Art

After a wafer is manufactured, the wafer is required to pass a test before shipment. Multiple testing programs (testing items) may be provided to perform the test. Referring to FIG. 1, which exemplarily shows a leakage current test performed on 200 memory dies. Here, a test is performed with a duration of 32 ms. FIG. 1 exemplarily shows the results of 100 tests. When the same memory die passes the same test, failure bits that occurred may be the same or different (bits A and B). Thus, how to find proper testing items for testing coverage is a topic worth exploring.

SUMMARY

The disclosure provides a method for determining a memory testing coverage. The method includes the following steps. Multiple testing programs are provided. Each of multiple memory dies is tested by using one of the testing programs each time to generate a failure bit information of each of the memory dies corresponding to each of the testing programs. The testing programs are independent programs. The failure bit information of each of the memory dies tested with each of the testing programs is acquired as an input data. A failure bit address information of each of the memory dies tested with each of the testing programs is acquired based on the failure bit information of each of the memory dies. For each of the memory dies, a common failure bit address among the testing programs or a different failure bit address of each of the testing programs is acquired based on the failure bit address information of each of the memory dies. A testing coverage is determined based on the common failure bit address. Alternatively, the testing coverage is determined based on the different failure bit address.

The disclosure provides a method for determining a memory stability. The method includes the following steps. A testing program is provided to perform multiple tests. Each of the tests is performed on each of multiple memory dies by the testing program to generate a failure bit information of each of the memory dies. The failure bit information of each of the memory dies tested through each of the tests performed by the testing program is acquired as an input data. A failure bit address information of each of the memory dies tested through each of the tests performed by the testing program is acquired based on the failure bit information of each of the memory dies. For each of the memory dies, a common failure bit address among each of the tests performed by the testing program or a different failure bit address of each of the tests performed by the testing program is acquired based on the failure bit address information of each of the memory dies. A testing coverage is determined based on the common failure bit address. Alternatively, the testing coverage is determined based on the different failure bit address.

BRIEF DESCRIPTION OF THE DRAWINGS

FIG. 3A is a schematic flowchart of a method for determining a memory testing coverage according to a first embodiment of the disclosure.

FIG. 4 exemplarily shows an example simulating the memory testing coverage shown in FIG. 3A.

FIG. 6 exemplarily shows an example simulating the memory testing coverage shown in FIG. 5A.

FIG. 7A is a schematic flowchart of a method for determining a memory stability according to a third embodiment of the disclosure.

FIG. 8A is a schematic flowchart of a method for determining a memory stability according to a fourth embodiment of the disclosure.

DESCRIPTION OF THE EMBODIMENTS

Figure 1:
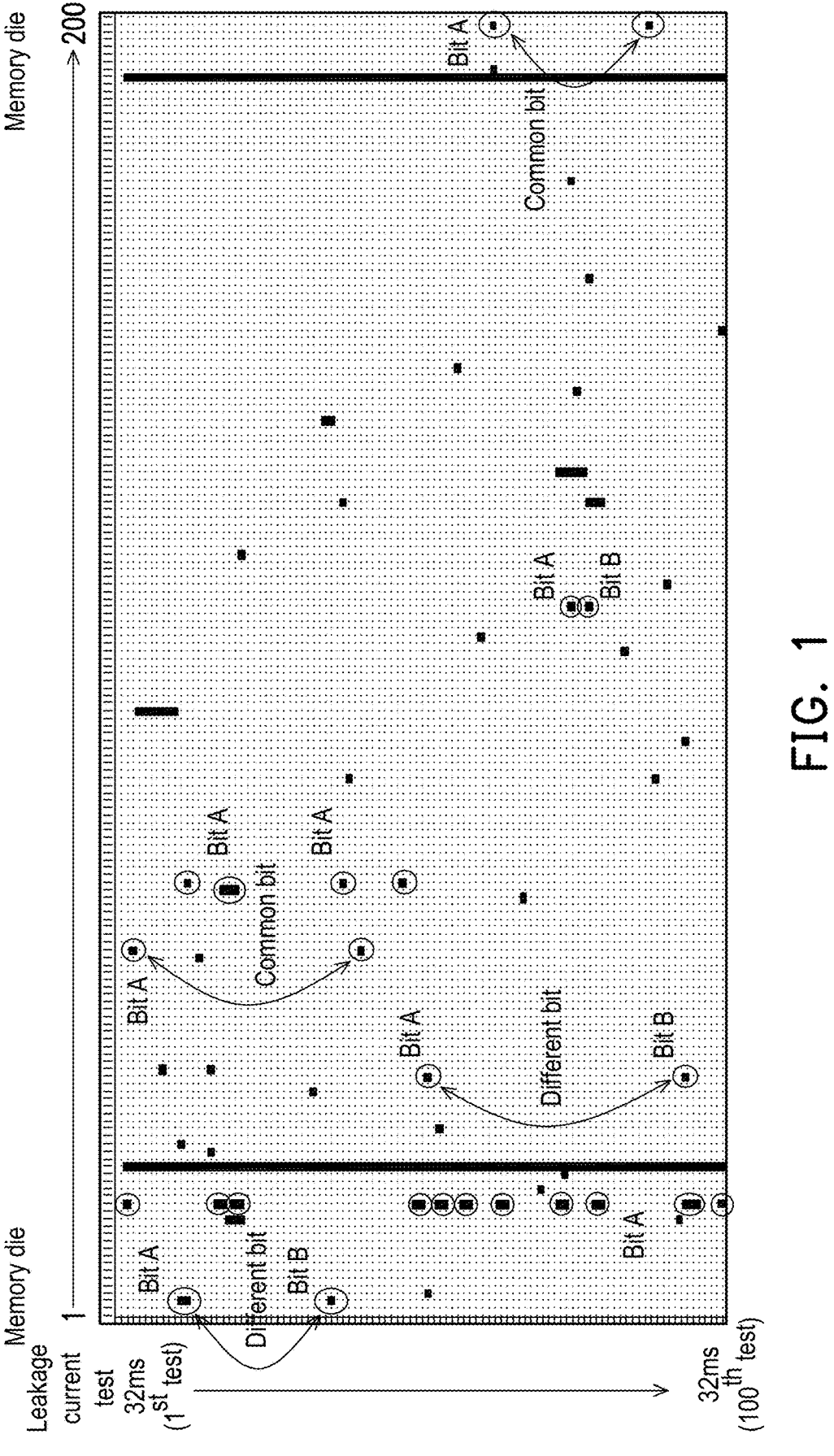
FIG. 1 is a schematic diagram of a testing result of a wafer.
Figure 2:
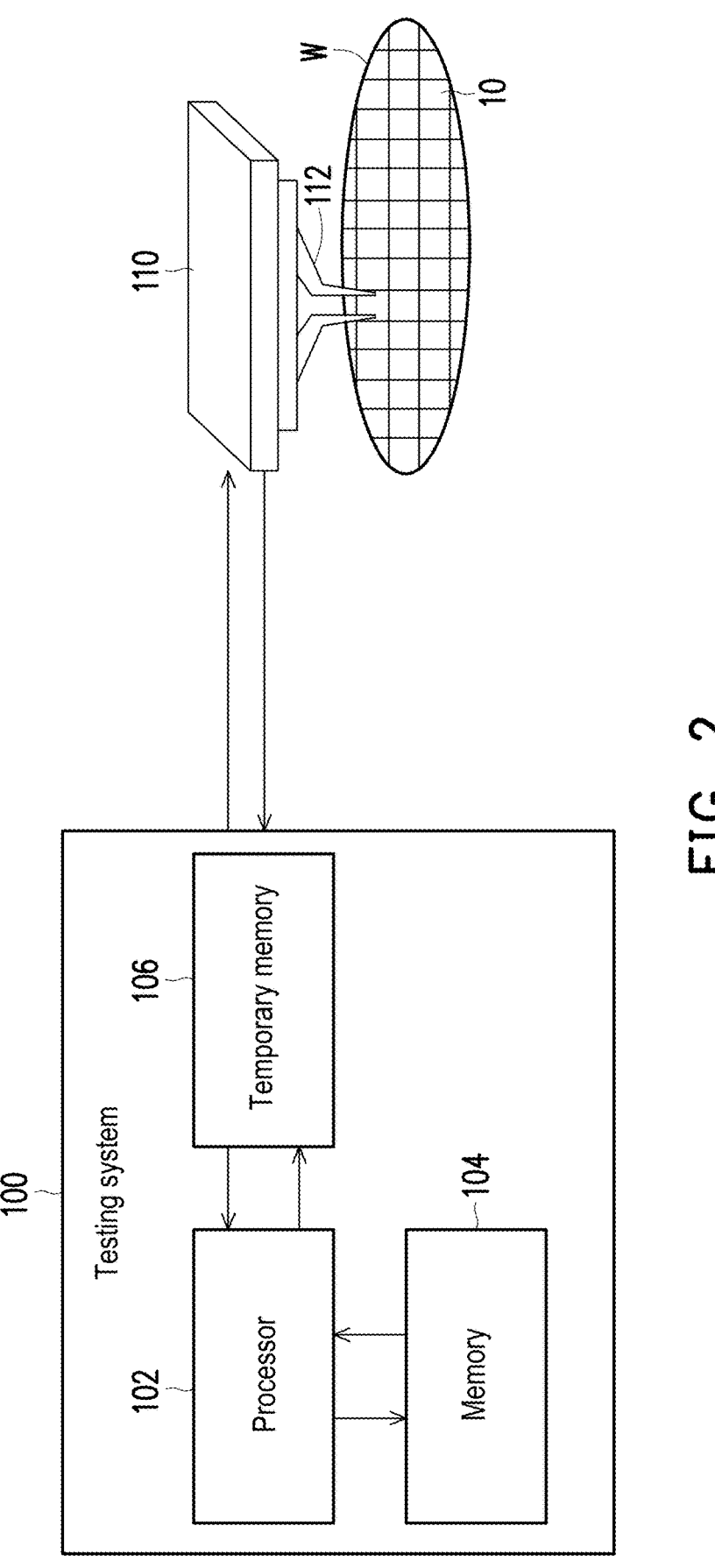
FIG. 2 exemplarily shows a structural schematic diagram of a testing system applicable in the embodiment of the disclosure.

First, a brief description of a testing system applicable in the embodiments of the disclosure is provided. As shown in FIG. 2, a testing system 100 may be a general testing system. However, after design, the testing system 100 may utilize artificial intelligence (AI) calculations to perform a method for determining memory stability and testing coverage of the disclosure. This method may be executed by, for example, a processor 102 of the testing system 100. The testing system 100 drives a testing tool 110 (e.g., a probe 112) to perform probe testing on a wafer W. The testing system 100 accepts a testing program including multiple testing items and uses the testing program to perform a test on each memory die 10 in the wafer W correspondingly. The testing system 100 may also include a memory 104 and a temporary memory 106 (e.g., a register in an implementation) that work in conjunction with the processor. The memory 104 may be used to store the testing program and testing results. The temporary memory 106 may be used to temporarily store the testing result of each memory die 10 after being tested with each testing program.

Figure 3B:
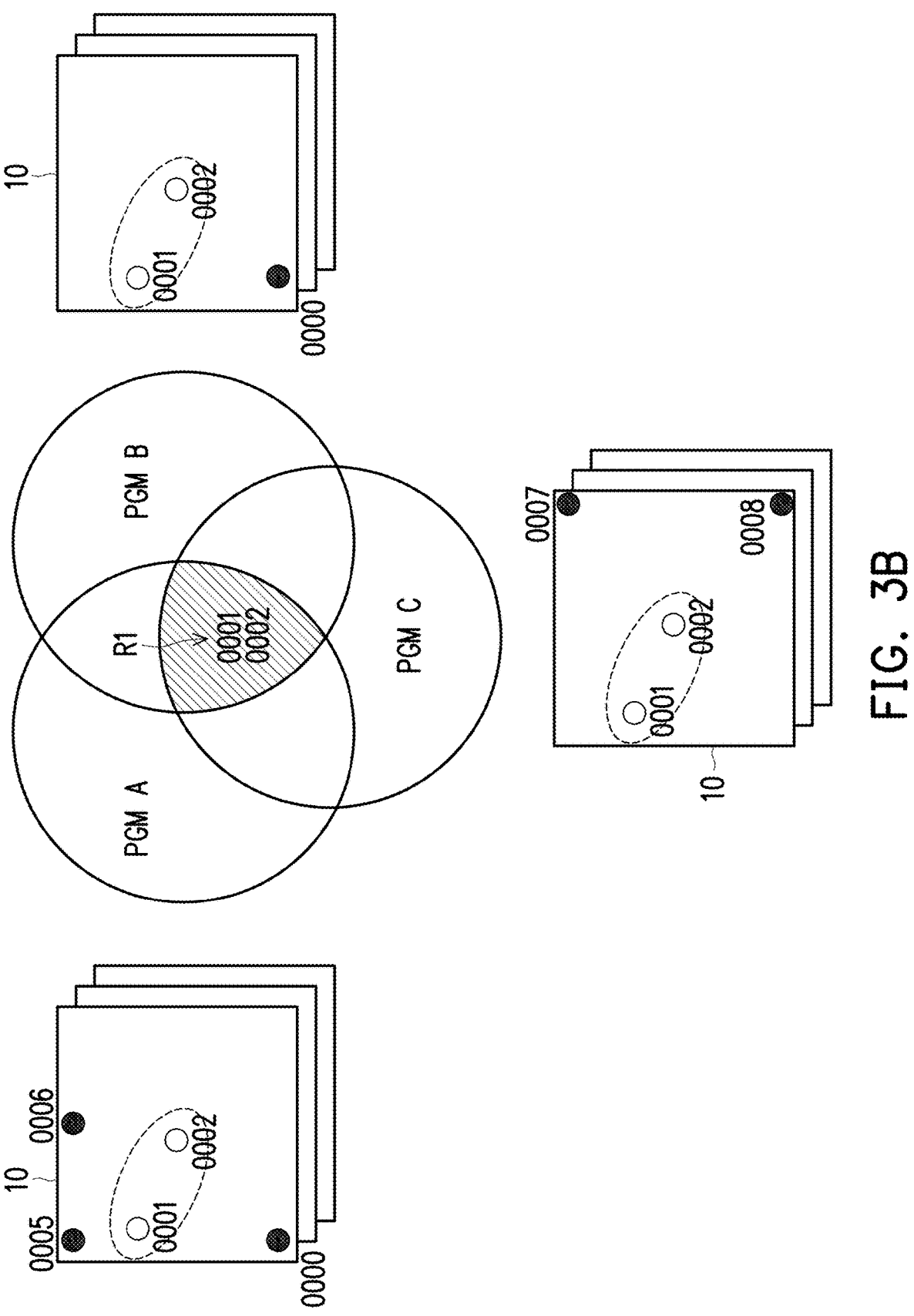
FIG. 3B exemplarily shows a conceptual diagram of the method shown in FIG. 3A.

Referring to FIGS. 3A and 3B, a description of the method for determining memory testing coverage in an embodiment of the disclosure is provided below. In this embodiment, multiple independent testing programs (e.g., testing programs PGM A, PGM B, and PGM C to PGM N) are used to test multiple memory dies 10 respectively. FIG. 3B only shows three testing programs and a memory die as examples. That is, each independent testing program (e.g., the testing program PGM A) tests each memory die 10. Furthermore, according to this embodiment, a number N of independent testing programs is at least two, and the number N does not necessarily have to be greater than three.

According to the concept of determination in the embodiment of the disclosure, a failure bit (FB), also referred to as a weak bit (WB), is acquired by, for example, testing the memory die 10 with the testing program PGM A. The number and addresses of the failure bits acquired through testing are, for example, 0000, 0001, 0002, 0005, 0006, etc. The number and addresses of the failure bits acquired by testing the memory die 10 with the testing program PGM B are, for example, 0000, 0001, and 0002. The number and addresses of the failure bits acquired by testing the memory die 10 with the testing program PGM C are, for example, 0001, 0002, 0007, and 0008. Common failure bits 0001 and 0002 acquired through different testing programs PGM A to PGM C are thereby acquired, thereby obtaining a testing coverage R1.

Next, a process of the method for determining memory testing coverage is described in detail. As shown in FIG. 3A, in Step S100, the testing programs PGM A to PGM N are provided. A testing program (e.g., the testing program PGM A) from the testing programs PGM A to PGM N is used to test each of the memory dies 10. Here, the testing programs PGM A to PGM N are independent programs. That is, each of the testing programs PGM A to PGM N corresponds to an independent testing item. Each of the testing programs PGM A to PGM N may correspond to a different testing item of the same test type or a different testing item of a different test type.

According to the embodiment of the disclosure, for example, the testing program PGM A is initially used to test each memory die 10 of the wafer. When a failure bit information in the memory die 10 is detected through the testing program PGM A, the failure bit information is recorded in the temporary memory 106 of the testing system 100. This process continues until the testing of the memory die 10 is completed. Afterwards, the testing program PGM A is used to test the next memory die 10 until all of the memory dies 10 are tested. The failure bit information may be, for example, a failure bit address information.

After all of the memory dies 10 are tested with the testing program PGM A, the next testing program PGM B is used to test each memory die 10 one by one in the same manner as above so as to acquire the failure bit information of each memory die 10 detected by the testing program PGM B. This process continues until the testing program PGM N is used.

In addition, after a memory die 10 is tested with each testing program, the failure bit information of the memory die 10 tested with the testing program is first stored in the temporary memory 106. When the failure bit information of the memory die 10 is stored in the temporary memory 106, the failure bit information is then transferred to the memory 104 of the testing system, and the content in the temporary memory 106 is cleared to store the failure bit information of the next memory die 10. This way, it is ensured that each memory die 10 has an independent failure bit information without interference from others.

Next, in Step S102, the testing system 100 acquires the failure bit information of each memory die 10 tested with each of the testing programs PGM A to PGM N. In other words, after testing with each of the testing programs PGM A to PGM N, the failure bit information of each memory die corresponding to each of the testing programs PGM A to PGM N is acquired by the testing system 100, serving as input data for calculating the testing coverage R1.

In Step S104, based on the failure bit information of each of the memory dies 10, a failure bit address information of each memory die 10 tested by each of the testing programs PGM A to PGM N is acquired. Here, for example, for the testing program PGM A, a failure bit address is decoded based on the failure bit information of the tested memory die 10. The failure bit address information of each memory die 10 is thereby obtained from the failure bit information. Similarly, the same failure bit address decoding is performed for each of the testing programs PGM B to PGM N to obtain the corresponding failure bit address information. In addition, as an example, the decoding of failure bit addresses may be performed using specific programming languages, such as Python, C, or other programming languages with similar functions. These programming languages are suitable for artificial intelligence calculations.

Next, in Step S106, for each memory die 10, a common failure bit address among the testing programs PGM A to PGM N is acquired based on the failure bit address information of each memory die 10. Here, as shown in FIG. 3B, a memory die 10 serves as an example. The failure bit address information of the memory die 10 acquired through the testing program PGM A is compared with that acquired through the testing program PGM B so as to determine and record the common failure bit address between the testing programs PGM A and PGM B. Next, the common failure bit address acquired this time is compared with the failure bit address information of the memory die 10 acquired through the next testing program PGM C so as to obtain the common failure bit address among the testing programs PGM A to PGM C. In this manner, the comparison procedure continues until the testing program PGM N is used, thereby obtaining the common failure bit address among the testing programs PGM A to PGM N. Similarly, as an example, the comparison of failure bit addresses may be performed using specific programming languages, such as Python, C, or other programming languages with similar functions.

In Step S108, a testing coverage is determined based on the common failure bit address. Through the common failure bit addresses, a region of the wafer W where the failure bits are located and regions of the memory dies 10 where the failure bits are located are shown. Accordingly, the testing coverage among each testing program may be calculated. The physical meaning represented by the common failure bit addresses may be, for example, severe defects in the memory dies 10 or the memory dies 10 requiring improvement in process yields.

Refer to FIG. 4, which exemplarily shows a diagram of an example simulating the method shown in FIG. 3A. Here, four types of testing programs are used as examples, including function, pause, margin, and timing tests. The functional test may include testing programs PGM 1-1 to PGM 1-5. The pause test may include testing programs PGM 2-1 to PGM 2-10. The margin test may include testing programs PGM 3-1 to PGM 3-7. The timing test may include testing programs PGM 4-1 to PGM 4-8. Here, though four types of testing programs are listed, more types of testing programs may be used in practice. The number of types required is at least two. In addition, testing programs of each type may include multiple testing items. The testing items may be determined according to actual needs and are not limited to the number shown in FIG. 4. In addition, the right column of each testing item represents the number of common failure bits determined through the method shown in FIG. 3A for each testing item.

In each type of testing programs, the testing item with the greatest number of common failure bits is determined, thereby determining the maximum testing coverage. For example, in the functional test, the testing program PGM 1-3 includes the testing item with the greatest number of common failure bits. The testing item may be, for example, a scan pattern test. In the pause test, the testing program PGM 2-4 includes the testing item with the greatest number of common failure bits. The testing item may be, for example, a cell pause and surround topology test. In the margin test, the testing program PGM 3-6 includes the testing item with the greatest number of common failure bits. The testing item may be, for example, a test for low leakage current of electrode plates and high leakage current of memory cells. In the timing test, the testing program PGM 4-5 includes the testing item with the greatest number of common failure bits. The testing item may be, for example, a row hammer test.

Accordingly, through the embodiments of the disclosure, the testing item with the maximum coverage of failure bits of each test type can be identified. The testing items with the maximum coverage of failure bits are thereby selected during testing instead of performing all testing items.

Figure 5A:
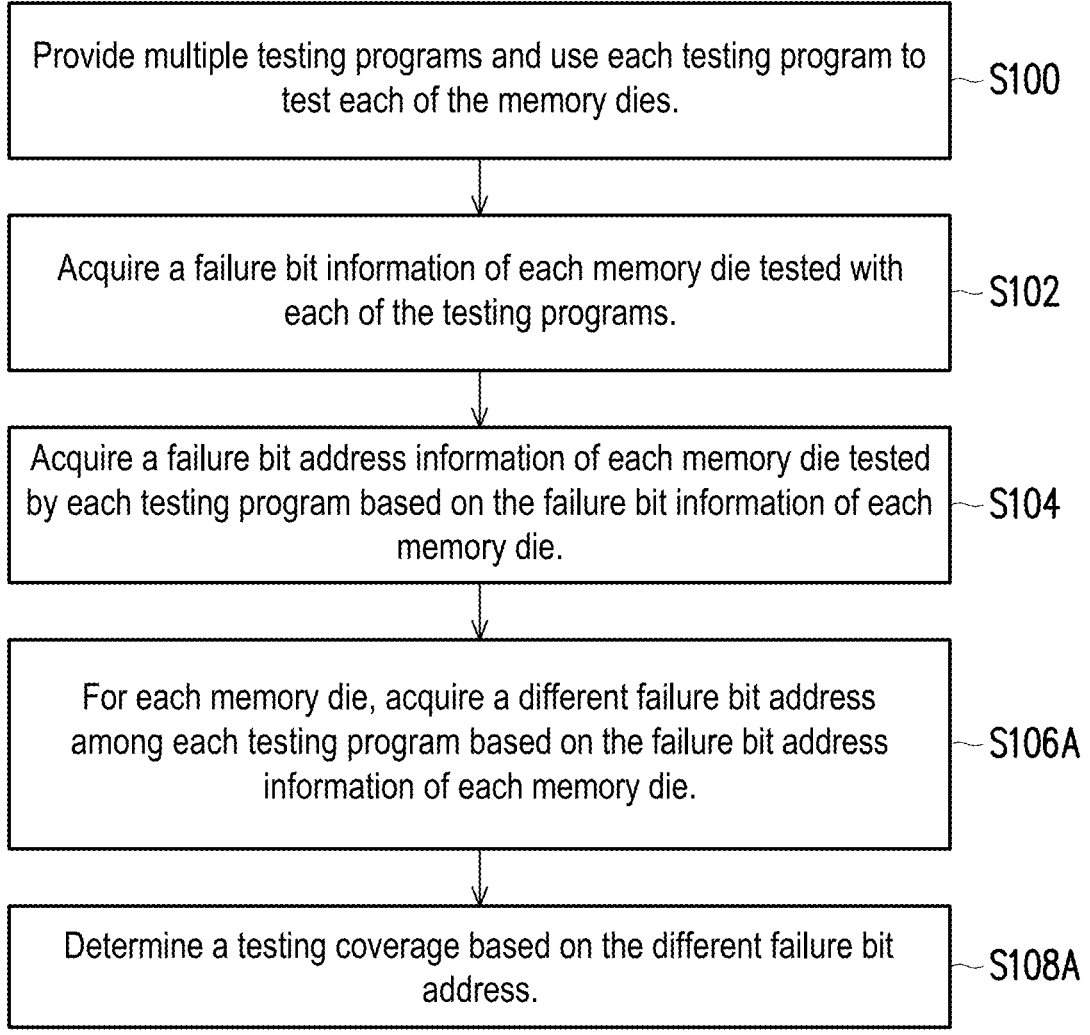
FIG. 5A is a schematic flowchart of a method for determining a memory testing coverage according to a second embodiment of the disclosure.
Figure 5B:
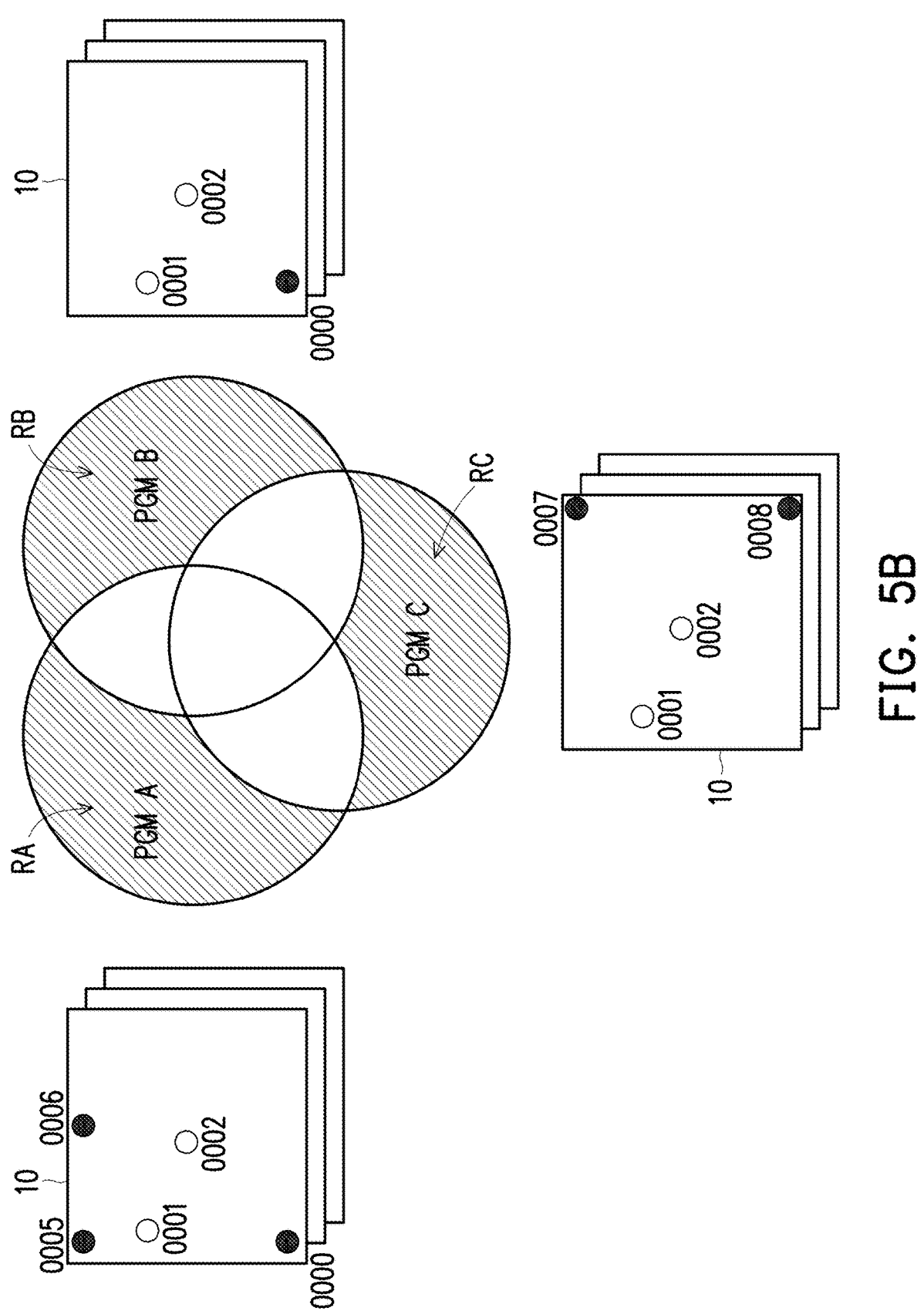
FIG. 5B exemplarily shows a conceptual diagram of the method shown in FIG. 5A.

FIGS. 5A and 5B exemplarily show a second embodiment of the disclosure, which, like the first embodiment, is a method for determining testing coverage. However, the difference between the two embodiments is that in the first embodiment, the common failure bit among each memory die is identified for each testing program, as shown in FIG. 4B. In this embodiment, on the other hand, the objective is to obtain different failure bits. The comparison details are the same as in FIGS. 4A and 4B. For example, by comparing the testing programs PGM A and PGM B, the different failure bits of the test results from the two testing programs are 0005 and 0006. Then, after the comparison with the testing program PGM C, it is known that only the testing coverage of different failure bits generated by the testing program PGM A includes the failure bits 0005 and 0006. Similarly, only the testing coverage of different failure bits generated by the testing program PGM B does not include different failure bits. Similarly, only the testing coverage of different failure bits generated by the testing program PGM C includes the different failure bits 0007 and 0008.

As shown in FIG. 5A, the process of the method for determining memory testing coverage in this embodiment is basically the same as Steps S100 to S104 in FIG. 3A. Thus, the description of the process is omitted. In addition, the method for comparing failure bits in Steps S106A and S108A are the same as the method in the first embodiment except for the different points.

In Step S106A, for each memory die 10, a different failure bit address among the testing programs PGM A to PGM N is acquired based on the failure bit address information of each memory die 10. For example, the failure bit address information of the memory die 10 acquired through the testing program PGM A is compared that acquired through the testing program PGM B, thereby excluding the failure bit address obtained by the testing program PGM A until the common failure bit address between the testing programs PGM A and PGM B remains so as to obtain the different failure bit address. Similarly, the results acquired are compared with the failure bit address acquired by the testing program PGM C, and the common part with the testing program PGM C is excluded to obtain the failure bit address only from the testing program PGM A, which serves as the different failure bit address of the testing program PGM A.

In Step S108A, a testing coverage is determined based on the different failure bit address. Through the different failure bit addresses, a region of the wafer W where the failure bits are located and regions of the memory dies 10 where the failure bits are located are shown. Accordingly, the testing coverage among each testing program may be calculated. The physical meaning represented by the different failure bit addresses may be, for example, the results from true margin testing items instead of severe defects (caused by, for example, short circuits or open circuits). For example, the results may be failure bits related to hold times or failure bits related to write times, both of which are related to timing items.

FIG. 6 exemplarily shows a diagram of an example simulating the method shown in FIG. 5A. Here, Region I, for example, represents items regarding severe defects. Region II represents items including pause/hold time/gate-induced drain leakage current. Region III represents word line/bit line/electrode plate leakage current and others. Region IV represents margin items (timing) and others. These are merely examples, and different manufacturers may have different testing items. Here, the number of different failure bits from each testing program can be converted into a proportion (percentage) through (the number of different failure bits from each testing item/total number of different failure bits). Thus, through the proportion of different failure bits from each testing program (testing item), the appropriate testing coverage is determined.

Figure 7B:
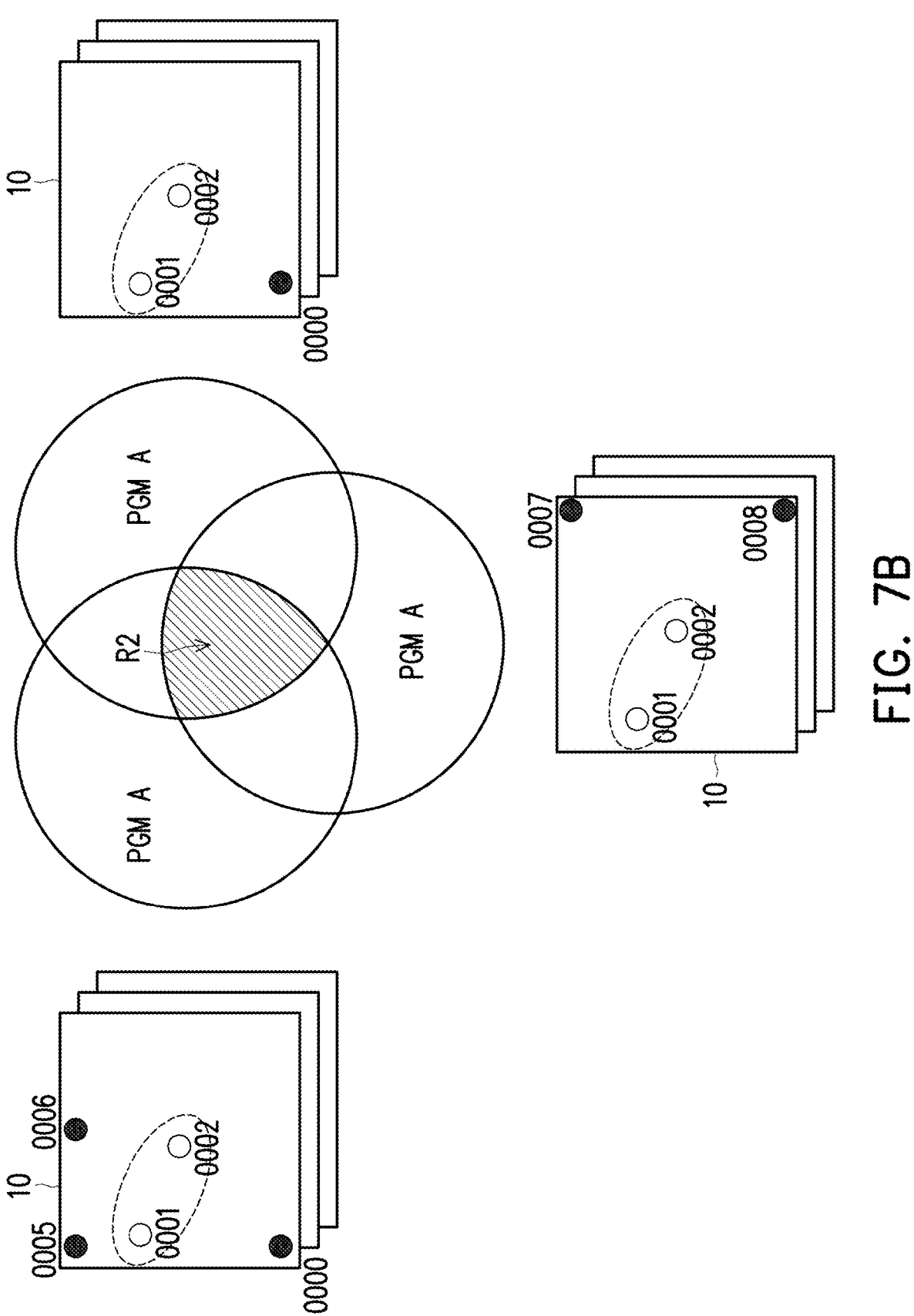
FIG. 7B exemplarily shows a conceptual diagram of the method shown in FIG. 7A.

FIGS. 7A and 7B exemplarily show a third embodiment of the disclosure. This embodiment is a method for determining memory stability. In this method, only a single testing program is used to perform multiple tests on each memory die 10.

As shown in FIG. 7B, according to the concept of determination in the embodiment of the disclosure, failure bits such as 0000, 0001, 0002, 0005, and 0006 are acquired by, for example, testing the memory die 10 with the testing program PGM A. Next, the memory die 10 is tested with the testing program PGM A again, and the number and addresses of the failure bits acquired are, for example, 0000, 0001, and 0002. Next, the memory die 10 is tested with the testing program PGM A again, and the number and addresses acquired are, for example, 0001, 0002, 0007, and 0008. Thus, the common failure bits acquired through each measurement performed by the testing program PGM A are 0001 and 0002. A testing coverage R2 is thereby obtained. This may represent unstable bits.

Next, a process of the method for determining memory stability is described in detail. As shown in FIG. 7A, in Step S200, the testing program PGM A is provided. Each memory die 10 is tested, thereby obtaining the failure bit information of each memory die 10.

According to the embodiment of the disclosure, for example, the testing program PGM A is initially used to test each memory die 10 of the wafer W. When a failure bit information in the memory die 10 is detected through the testing program PGM A, the failure bit information is recorded in the temporary memory 106 of the testing system 100. This process continues until the testing of the memory die 10 is completed. Afterwards, the testing program PGM A is used to test the next memory die 10 until all of the memory dies 10 are tested.

After all of the memory dies 10 are tested with the testing program PGM A, the testing program PGM A is used to test each memory die 10 again so as to acquire the failure bit information of each memory die 10 detected by the testing program PGM A in the second test of each memory die 10. The process continues until a determined number of tests are completed.

Next, in Step S202, the testing system 100 acquires the failure bit information of each memory die 10 acquired through the tests performed by the testing program PGM A. In other words, after each test performed by the testing program PGM A, the failure bit information of each memory die 10 can be acquired by the testing system 100 as input data for calculating the memory stability.

In Step S204, based on the failure bit information of each of the memory dies 10, a failure bit address information of each memory die 10 tested through each test performed by the testing program PGM A is acquired. Here, a failure bit address is decoded based on the failure bit information of the tested memory die 10. The failure bit address information of each memory die 10 is thereby obtained from the failure bit information. In addition, as an example, the decoding of failure bit addresses may be performed using specific programming languages, such as Python, C, or other programming languages with similar functions.

Next, in Step S206, for each memory die 10, a common failure bit address among the tests performed by the testing program PGM A is acquired based on the failure bit address information of each memory die 10. Here, as shown in FIG. 7B, a memory die 10 serves as an example. The failure bit address information of the memory die 10 acquired through a first test performed by the testing program PGM A is compared with that acquired through a second test performed by the testing program PGM A so as to determine and record the common failure bit address between the two tests performed by the testing program PGM A. Next, the common failure bit address acquired this time is compared with the failure bit address information of the memory die 10 acquired through the next test performed by the testing program PGM A so as to obtain the common failure bit address among the three tests performed by the testing program PGM A. In this manner, the comparison procedure continues until the expected number of tests are completed, thereby obtaining the common failure bit address among each test performed by the testing program PGM A.

In Step S208, a testing coverage is determined based on the common failure bit address. Through the common failure bit addresses, a region of the wafer W where the failure bits are located and regions of the memory dies 10 where the failure bits are located are shown. Accordingly, the testing coverage among each test performed by the testing program may be calculated. The physical meaning represented by the common failure bit addresses may be, for example, determining whether the coverage of the failure bits is sufficient. Voltage and temperature may be further tested according to the results to prevent the failure bits and tail bits from flowing to subsequent tests, thereby improving the quality and reliability of the memory die 10.

Figure 8B:
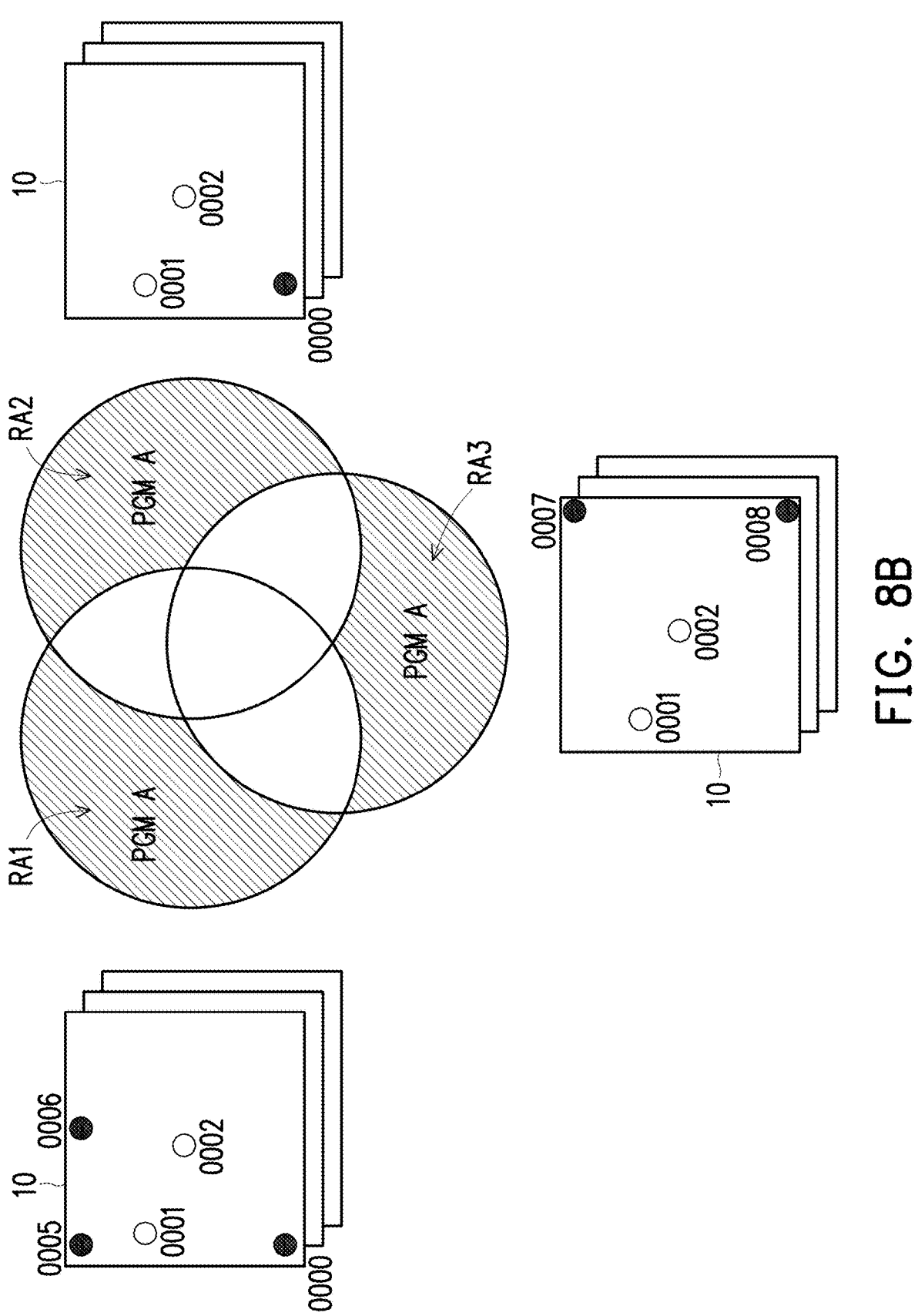
FIG. 8B exemplarily shows a conceptual diagram of the method shown in FIG. 8A.

FIGS. 8A and 8B exemplarily show a fourth embodiment of the disclosure, which is similar to the method in the third embodiment. The difference between the two embodiments is that in this embodiment, a different failure bit among testing programs is obtained. As shown in FIG. 8B, the details of the comparison method are the same as in FIGS. 7A and 7B. For example, by comparing the failure bit addresses between the first and second tests performed by the testing program PGM A, the different failure bits 0005 and 0006 from the test results of the two tests performed by the testing program PGM A are obtained. Then, after the comparison with the third test performed by the testing program PGM A, it is known that only the testing coverage of different failure bits generated from the first test performed by the testing program PGM A includes the failure bits 0005 and 0006. Similarly, only the testing coverage of different failure bits generated from the second test performed by the testing program PGM A does not include different failure bits. Similarly, only the testing coverage of different failure bits generated from the third test performed by the testing program PGM A includes the different failure bits 0007 and 0008.

As shown in FIG. 8A, the process of the method for determining memory testing coverage in this embodiment is basically the same as Steps S200 to S204 in FIG. 7A. Thus, the description of the process is omitted. In addition, the method for comparing failure bits in Steps S206A and S206B are the same as the method in the third embodiment except for the different points.

In Step S206A, for each memory die 10, a different failure bit address among each test performed by the testing program PGM A is acquired based on the failure bit address information of each memory die 10. For example, the failure bit address information of the memory die 10 acquired through the first test performed by the testing program PGM A is compared with that acquired through the second test performed by the testing program PGM A, thereby excluding the failure bit address obtained through the first test performed by the testing program PGM A until the common failure bit address between the first and second tests performed by the testing program PGM A remains so as to obtain the different failure bit address. Similarly, the results acquired are compared with the failure bit address acquired through the third test performed by the testing program PGM A, and the common part with the third test performed by the testing program PGM A is excluded to obtain the failure bit address only from the first test performed by the testing program PGM A, which serves as the different failure bit address of the first test performed by the testing program PGM A.

In Step S208A, a testing coverage is determined based on the different failure bit address. Through the different failure bit addresses, a region of the wafer W where the failure bits are located and regions of the memory dies 10 where the failure bits are located are shown. Accordingly, the testing coverage among each test performed by the same testing program may be calculated. The physical meaning represented by the different failure bit addresses may be, for example, a result from the instability of the wafer W or the testing environment. Even when the same testing program is used, additional failure bits continue to occur. Thus, it is necessary to improve wafer quality and enhance the functionality of the guard band or error correction codes in the tests to solve the problem of increasing failure bits.

Figure 9:
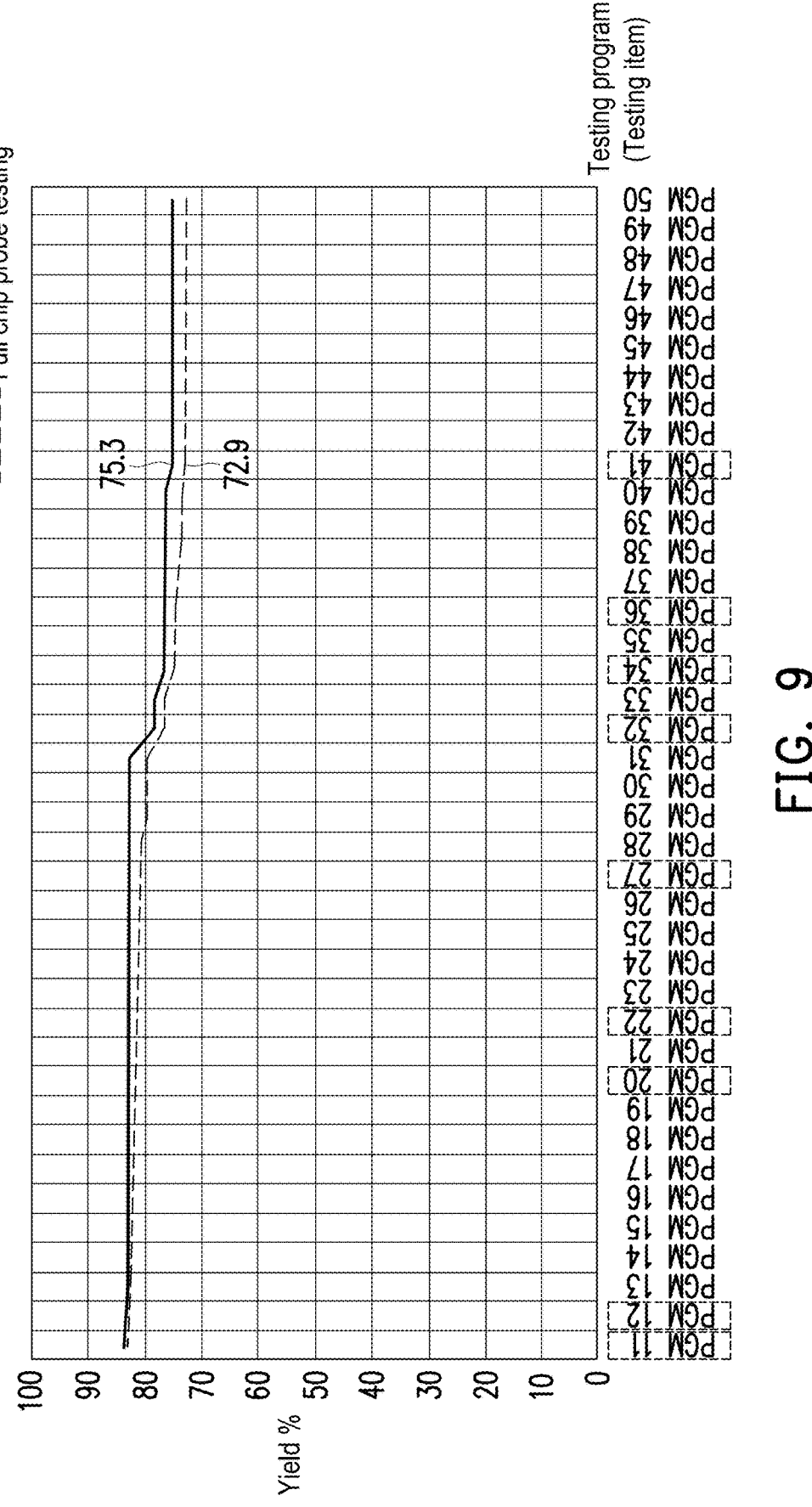
FIG. 9 exemplarily shows a schematic diagram of a testing result of an application of the embodiment of the disclosure.

FIG. 9 exemplarily shows a schematic diagram applying the above embodiments, showing the relationship between the testing programs (testing items) and the yield. For example, during testing of each memory die 10 of the wafer W, when full chip probe testing is performed, multiple testing items including testing programs PGM 11 to PGM 50 are generally adopted. If a high testing coverage is obtained and unstable failure bits are excluded through the method described above, tiny chip probe testing is performed by using, for example, testing programs PGM 11, PGM 13, PGM 20, PGM 22, PGM 27, PGM 32, PGM 34, PGM 36, and PGM 41. Based on the diagram, it is known that the yields resulting from both tests are almost equal. Even with testing time reduction (TTR), the yield difference is less than approximately 1% to 2%.

Thus, through the method of the disclosure, the number of testing items may be reduced while maintaining testing accuracy, thereby effectively reducing testing costs.

What is claimed is:

1. A method for determining a memory testing coverage, comprising:

providing a plurality of testing programs for each test type, and testing each of a plurality of memory dies by using one of the plurality of testing programs each time to generate a failure bit information of each of the plurality of memory dies corresponding to each of the plurality of testing programs, wherein the plurality of testing programs are a plurality of independent programs;

acquiring the failure bit information of each of the plurality of memory dies tested with each of the plurality of testing programs as an input data;

acquiring a failure bit address information of each of the plurality of memory dies tested with each of the plurality of testing programs based on the failure bit information of each of the plurality of memory dies;

for each of the plurality of memory dies, acquiring a common failure bit address among the plurality of testing programs or a different failure bit address of each of the plurality of testing programs based on the failure bit address information of each of the plurality of memory dies;

determining a testing coverage based on the common failure bit address, or determining the testing coverage based on the different failure bit address; and determining a testing program to be performed, for the each test type during testing, among the plurality of testing programs based on the testing coverages of the plurality of testing programs instead of performing all of the plurality of testing programs.

2. The method for determining the memory testing coverage according to claim 1, further comprising:

successively recording each of the plurality of memory dies in a specific memory area when one of the plurality of testing programs performs a test;

clearing the specific memory area after each of the plurality of testing programs completes testing; and proceeding to a test performed by a next testing program of the plurality of testing programs.

3. The method for determining the memory testing coverage according to claim 1, wherein acquiring the common failure bit address further comprises:

for each of the plurality of testing programs, decoding a failure bit address based on the failure bit information of each of the plurality of memory dies to obtain the failure bit address information of each of the plurality of memory dies.

4. The method for determining the memory testing coverage according to claim 1, wherein when the common failure bit address among the plurality of testing programs is acquired, the failure bit address information of each of the plurality of testing programs is compared successively until all of the plurality of testing programs are compared so as to obtain the common failure bit address among the plurality of testing programs.

5. The method for determining the memory testing coverage according to claim 1, wherein when the different failure bit address among the plurality of testing programs is acquired, the failure bit address information of each of the plurality of testing programs is compared successively until all of the plurality of testing programs are compared so as to obtain the different failure bit address of each of the plurality of testing programs.

6. The method for determining the memory testing coverage according to claim 5, wherein the different failure bit address of each of the plurality of testing programs is a failure bit address of each of the plurality of testing programs excluding the failure bit address of an other testing program.

7. The method for determining the memory testing coverage according to claim 1, wherein the method is performed through an artificial intelligence calculation method.

8. The method for determining the memory testing coverage according to claim 1, wherein the plurality of testing programs comprise at least two testing programs.

9. A method for determining a memory stability, comprising:

providing a testing program to perform a plurality of tests, wherein each of the plurality of tests is performed on each of a plurality of memory dies by the testing program to generate a failure bit information of each of the plurality of memory dies;

acquiring the failure bit information of each of the plurality of memory dies tested through each of the plurality of tests performed by the testing program as an input data;

acquiring a failure bit address information of each of the plurality of memory dies tested through each of the plurality of tests performed by the testing program based on the failure bit information of each of the plurality of memory dies;

for each of the plurality of memory dies, acquiring a common failure bit address among each of the plurality of tests performed by the testing program or a different failure bit address among each of the plurality of tests performed by the testing program based on the failure bit address information of each of the plurality of memory dies;

determining a testing coverage based on the common failure bit address, or determining the testing coverage based on the different failure bit address; and determining the testing program is performed during testing based on comparing of the testing coverage of testing program and a testing coverage of another testing program.

10. The method for determining the memory stability according to claim 9, further comprising:

successively recording each of the plurality of memory dies in a specific memory area when one of the plurality of tests is performed by the testing program;

clearing the specific memory area after each of the plurality of tests performed by the testing program is completed; and proceeding to a next test of the plurality of tests performed by the testing program.

11. The method for determining the memory stability according to claim 9, wherein acquiring the common failure bit address further comprises:

for each of the plurality of tests performed by the testing program, decoding a failure bit address based on the failure bit information of each of the plurality of memory dies to obtain the failure bit address information of each of the plurality of memory dies.

12. The method for determining the memory stability according to claim 9, wherein when the common failure bit address among each of the plurality of tests performed by the testing program is acquired, the failure bit address information of each of the plurality of tests performed by the testing program is compared successively until all of the plurality of tests performed by the testing program are compared so as to obtain the common failure bit address among each of the plurality of tests performed by the testing program.

13. The method for determining the memory stability according to claim 9, wherein when the different failure bit address among the plurality of tests performed by the testing program is acquired, the failure bit address information of each of the plurality of tests performed by the testing program is compared successively until all of the plurality of tests performed by the testing program are compared so as to obtain the different failure bit address of each of the plurality of tests performed by the testing program.

14. The method for determining the memory stability according to claim 13, wherein the different failure bit address of each of the plurality of tests performed by the testing program is a failure bit address of each of the plurality of tests performed by the testing program excluding the failure bit address of an other test performed by the testing program.

15. The method for determining the memory stability according to claim 9, wherein the method is performed through an artificial intelligence calculation method.

16. The method for determining the memory stability according to claim 9, wherein the testing program performs at least two tests.

\* \* \* \* \*